US010637422B1

(12) United States Patent
Delshadpour et al.

(10) Patent No.: US 10,637,422 B1
(45) Date of Patent: Apr. 28, 2020

(54) GAIN COMPENSATION FOR AN OPEN LOOP PROGRAMMABLE AMPLIFIER FOR HIGH SPEED APPLICATIONS

(71) Applicant: NXP B.V., Eindhoven (NL)

(72) Inventors: Siamak Delshadpour, Phoenix, AZ (US); Xueyang Geng, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/176,424

(22) Filed: Oct. 31, 2018

(51) Int. Cl.
*H03G 3/30* (2006.01)
*H03G 1/00* (2006.01)

(52) U.S. Cl.
CPC ............ *H03G 3/30* (2013.01); *H03G 1/0029* (2013.01)

(58) Field of Classification Search
CPC ...................................................... H03G 3/30
See application file for complete search history.

(56) References Cited

U.S. PATENT DOCUMENTS

| 6,091,275 A * | 7/2000 | Behzad | H03G 7/06 |
| | | | 327/362 |
| 9,325,287 B2 | 4/2016 | Jayaraman et al. | |
| 2002/0050861 A1 * | 5/2002 | Nguyen | H03F 1/3211 |
| | | | 330/254 |
| 2003/0030491 A1 * | 2/2003 | Hart | H03F 3/45183 |
| | | | 330/254 |
| 2005/0024142 A1 * | 2/2005 | Sowlati | H03F 3/45098 |
| | | | 330/254 |
| 2009/0261899 A1 * | 10/2009 | Gomez | H03G 3/001 |
| | | | 330/2 |
| 2011/0080218 A1 * | 4/2011 | Zuffada | H03H 11/0422 |
| | | | 330/278 |
| 2013/0344834 A1 * | 12/2013 | Souto Diez | H03D 7/1441 |
| | | | 455/245.1 |
| 2019/0089319 A1 * | 3/2019 | Korol | H03G 3/3068 |

* cited by examiner

*Primary Examiner* — Patricia T Nguyen

(57) ABSTRACT

Various embodiments relate to a method and apparatus for maintaining constant gain in an open loop gain stage amplifier, the circuit including a reference signal generator configured to generate a plurality of reference voltages, a gain compensation circuit, including a reference selector configured to select one of the plurality of reference voltages for each of a plurality of gain stages, an error amplifier configured to output a control voltage signal to a selector, a selector configured to select which of a plurality of degeneration resistors in the open loop gain stage amplifier to apply the control voltage signal wherein the voltage signal is applied to the gate of at least one of the plurality of degeneration resistors in the open loop gain stage amplifier.

12 Claims, 6 Drawing Sheets

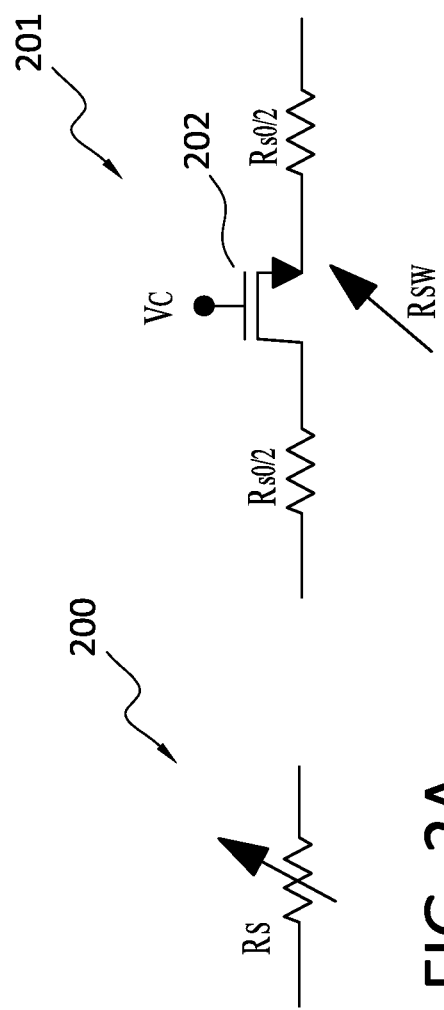

GAIN COMPENSATION FOR AN OPEN LOOP PROGRAMMABLE AMPLIFIER FOR HIGH SPEED APPLICATIONS

TECHNICAL FIELD

This disclosure relates generally to obtaining a constant gain parameter for an amplifier, and more specifically, but not exclusively, to a method for keeping the gain of an open loop amplifier with degeneration resistance constant.

SUMMARY OF EXEMPLARY EMBODIMENTS

A brief summary of various embodiments is presented below. Embodiments address the need to create gain compensation for an open loop programmable amplifier for high speed applications.

In order to overcome these and other shortcomings of the prior art and in light of the need to create gain compensation for an open loop programmable amplifier for high speed applications, a brief summary of various exemplary embodiments is presented. Some simplifications and omissions may be made in the following summary, which is intended to highlight and introduce some aspects of the various exemplary embodiments, but not to limit the scope of the invention.

Detailed descriptions of a preferred exemplary embodiment adequate to allow those of ordinary skill in the art to make and use the inventive concepts will follow in later sections.

Various embodiments relate to a circuit for maintaining constant gain in an open loop gain stage amplifier, the circuit including a reference signal generator configured to generate a plurality of reference voltages, a gain compensation circuit, including a reference selector configured to select one of the plurality of reference voltages for each of a plurality of gain stages, an error amplifier configured to output a control voltage signal to a selector, where the control voltage signal keeps gain constant over PVT, a selector configured to select which of a plurality of degeneration resistors in the open loop gain stage amplifier to apply the control voltage signal, wherein the voltage signal is applied to the gate of at least one of the plurality of degeneration resistors in the open loop gain stage amplifier.

In an embodiment of the present disclosure, the circuit for maintaining constant gain in an open loop gain stage amplifier, further including a feedback loop configured to maintain the gain for each of the plurality of gain stages with the plurality of reference voltages.

In an embodiment of the present disclosure, the open loop gain stage amplifier is implemented in a complementary metal-oxide semiconductor ("CMOS") transistor and a bipolar CMOS transistor.

In an embodiment of the present disclosure, the reference signal generator matches each of the plurality of reference voltages to another one of the plurality of reference voltages.

In an embodiment of the present disclosure, the reference signal generator includes a scaling factor to lower current and increase the degeneration resistor value to save current.

In an embodiment of the present disclosure, the gain for each of the plurality of gain stages is a ratio of the plurality of reference voltages.

In an embodiment of the present disclosure, the control voltage is used to adjust a bias current of a differential pair of transistors.

Various embodiments relate to a method for maintaining constant gain in an open loop gain stage amplifier, the method including the steps of generating, by a reference signal generator, a plurality of reference voltages, selecting, by a reference selector in a gain compensation circuit, one of the plurality of reference voltages for each of a plurality of gain stages, outputting, by an error amplifier, a control voltage signal to a selector, where the control voltage signal keeps gain constant over PVT, selecting, by a selector, which of a plurality of degeneration resistors in the open loop gain stage amplifier to apply the control voltage signal, wherein the voltage signal is applied to the gate of at least one of the plurality of degeneration resistors in the open loop gain stage amplifier.

In an embodiment of the present disclosure, the method for maintaining constant gain in an open loop gain stage amplifier, the method further including the steps of maintaining, by a feedback loop, the gain for each of the plurality of gain stages with the plurality of reference voltages.

In an embodiment of the present disclosure, the open loop gain stage amplifier is implemented in a complementary metal-oxide semiconductor ("CMOS") transistor and a bipolar CMOS transistor.

In an embodiment of the present disclosure, the reference signal generator matches each of the plurality of reference voltages to another one of the plurality of reference voltages.

In an embodiment of the present disclosure, the reference signal generator includes a scaling factor to lower current and increase the degeneration resistor value to save current.

In an embodiment of the present disclosure, the gain for each of the plurality of gain stages is a ratio of the plurality of reference voltages.

In an embodiment of the present disclosure, the control voltage is used to adjust a bias current of a differential pair of transistors.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

These and other more detailed and specific features are more fully disclosed in the following specification, reference being had to the accompanying drawings, in which:

FIGS. 2A and 2B illustrate a circuit diagram for degeneration resistors of the current embodiment;

DETAILED DESCRIPTION OF THE INVENTION

Figures 1A, 1B, 1C:
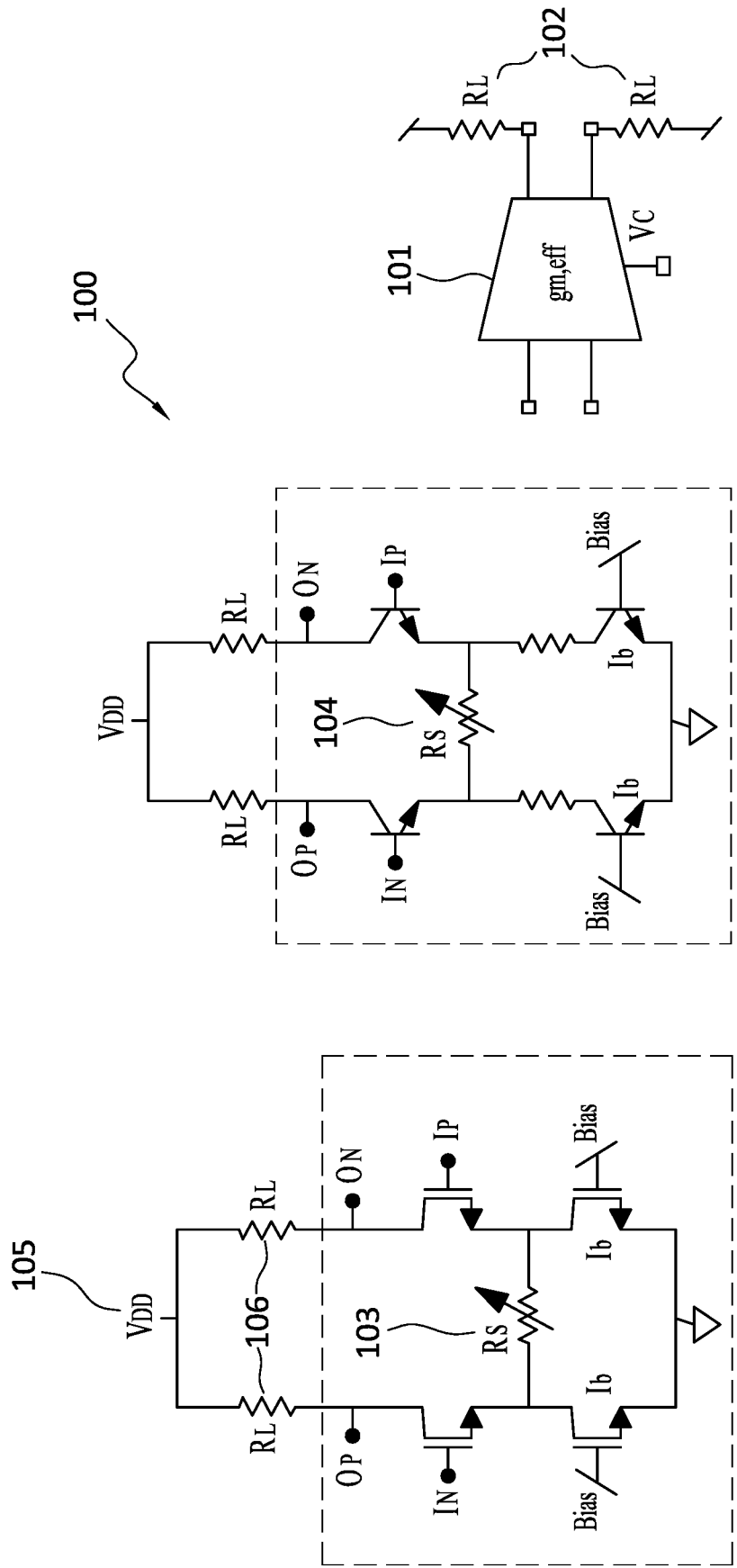
FIGS. 1A, 1B, and 1C illustrate circuit diagram for open loop gain stage for CMOS, bipolar and a simplified version of both as an effective gm cell with load resistance of the current embodiment.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable.

The main function of a programmable gain amplifier ("PGA") or a variable gain amplifier ("VGA") is to provide a fixed voltage output for different input signal levels which improves the dynamic range of the system.

PGAs and VGAs are used in wireless radio frequency ("RF") transceivers. PGAs provide gain steps with accuracy as the gain can be controlled by a feedback system or can be set externally.

High speed linear redrivers require a high bandwidth PGA with a low dynamic range, approximately 4 dB range that compensate for process, voltage and temperature ("PVT") variation in the redriver components and in the GHz range bandwidth, using open loop architecture is the only option. Closed loop gain stages use feedback and provide a high accuracy gain, but have limited bandwidth due to a feedback system.

A closed loop gain stage is used for PGAs because a closed loop provides gain control and less gain variation because of the feedback system, and an open loop gain stage is less complicated, consumes less power, but has gain variation and offers less linearity.

A degeneration resistor may be applied in an open loop gain stage in PGAs. This refers to the addition of a resistor, Rs (or any impedance) between the emitter of bipolar (or source of MOS) and the common signal source (e.g., the ground reference or a power supply rail) of a transistor. This impedance reduces the overall transconductance of the circuit from "gm" by a factor of $1/(1+gm*Rs)$. The gain of an open loop PGA is Gain=Gm,eff*RL, where effective transconductance, Gm,eff is adjusted to provide gain steps. The resistor-inductor ("RL") circuit may be adjusted too, but not a good choice for high speed applications.

If the effective transconductance is approximately 1/Rs, the gain is linear, however, the effective transconductance, Gm,eff=gm0/(1+gm0*Rs), which is a nonlinear term and varies over PVT because of a variation in the transconductance of the differential pair. Therefore, to have a gain stage with a minimum gain variation for a gain step, the effective transconductance must be controlled.

In order to have the effective transconductance of approximately 1/Rs, which requires gm0*Rs>1, either the transconductance, gm0 of the differential pair must be large or source resistance ("Rs") must be large, and for high speed applications, load resistance, RL and gain are limited; therefore, transconductance, gm0 must be high which requires high current.

Therefore, using an open-loop structure achieves gain control by varying the transconductance, gm or load value of an amplifier stage, and while the signal bandwidth of an open-loop structure is wide, it is sensitive to PVT variation.

The current embodiment is directed towards maintaining as constant the gain of an open loop gain stage over PVT, compensating for PVT variation of a load resistor, and PVT variation of transconductance of differential pair transistors. The current embodiment may be used with both complementary metal-oxide semiconductor ("CMOS") and bipolar CMOS ("BiCMOS") technologies, may be used for both low headroom and high headroom application of open loop stages and may be applicable for low and high dynamic range open loop gain stages.

By using the method of the current embodiment, the gain of an open loop gain stage is kept constant, the degeneration resistor is adjusted to keep transconductance of the gain stage constant, the on-chip load resistor value may be adjusted, and Gain=Gm*RL remains constant by adjusting based on different transconductance values to ensure gain for each step is constant and does not change biasing current, which may reduce headroom and therefore does not degrade original linearity.

FIGS. 1A, 1B, and 1C illustrate circuit diagram 100 for open loop gain stage for CMOS, bipolar and an effective gm cell with load resistance of the current embodiment.

FIG. 1A illustrates a simple open loop gain stage, with one gain setting with a degeneration resistor 103 in a CMOS implementation.

FIG. 1B illustrates a simple open loop gain stage, with one gain setting with a degeneration resistor 104 in a BiCMOS implementation.

FIG. 1C illustrates a simple open loop gain stage in the form of an effective transconductance, gm,eff cell 101 with resistance load, RL 102.

For the illustrated gain stage, the gain is equal to the effective transconductance multipled by the resistor-inductor load, gain=Gm,eff*RL and Gm,eff=gm0/(1+gm0*Rs), where Gm,eff is the effective transconductance, gm is the transconductance and Rs is the degenerations resistor value, where gm0=Id/(Vgs−Vt) for a CMOS implementation and gm0=Ic/VT for a bipolar transistor (Id=Ic=Ib) implementation.

FIGS. 2A and 2B illustrate a circuit diagram for two degeneration resistors of the current embodiment.

FIG. 2A illustrates a degeneration resistor 200. FIG. 2B illustrates a degeneration resistor 201 which includes a switch 202. In the long channel resistor 201, the switch 202 may vary the resistance of the resistor 201, by varying the voltage, Vc which controls the gate of the switch 202. Voltage, Vc may be an analog voltage which may control the long channel MOS resistor 201.

When using the analog voltage to control the effective transconductance, Gm,eff, this switch will be large enough and the effective degeneration resistor 201 may be 2*Rs0/2, where the control loop may control the bias current of the differential pair.

The value of the degeneration resistor 201 may be Rs=2*Rs0/2+Rsw=Rs0+Rsw, where Rsw is the resistance of the switch 202 and the switch 202 is controlled by voltage, Vc.

The current embodiment is directed to compensate for all PVT gain variation by the resistance of the switch, Rsw 202 which should compensate for all possible variation.

If the gain variation over PVT is G0+/−Δ, where G0 is the original gain, then G0−Δ<Gain<G0+Δ.

By applying the gain stage equation and the degeneration resistor equations into the gain variation equation, G0−Δ<RL*gm0/(1+gm0*(Rs0+Rsw))<G0+Δ.

By applying the above equation with respect to the resistance of the switch Rsw 202, the resistance of the switch is RL/(G0+Δ)−1/gm0−Rs0<Rsw<(RL/(G0−Δ)−1/gm0−Rs, and depending on the value of the degeneration resistor, Rs0 200, the value of the resistance of the switch, Rsw 201, which is being selected by W/L of the switch in the triode mode may be chosen to compensate for the gain variation, Δ.

For example, using a linear redriver PGA, the required gain steps are −4 dB, −2 dB, 0 dB, 2 dB and 4 dB.

Figure 3:
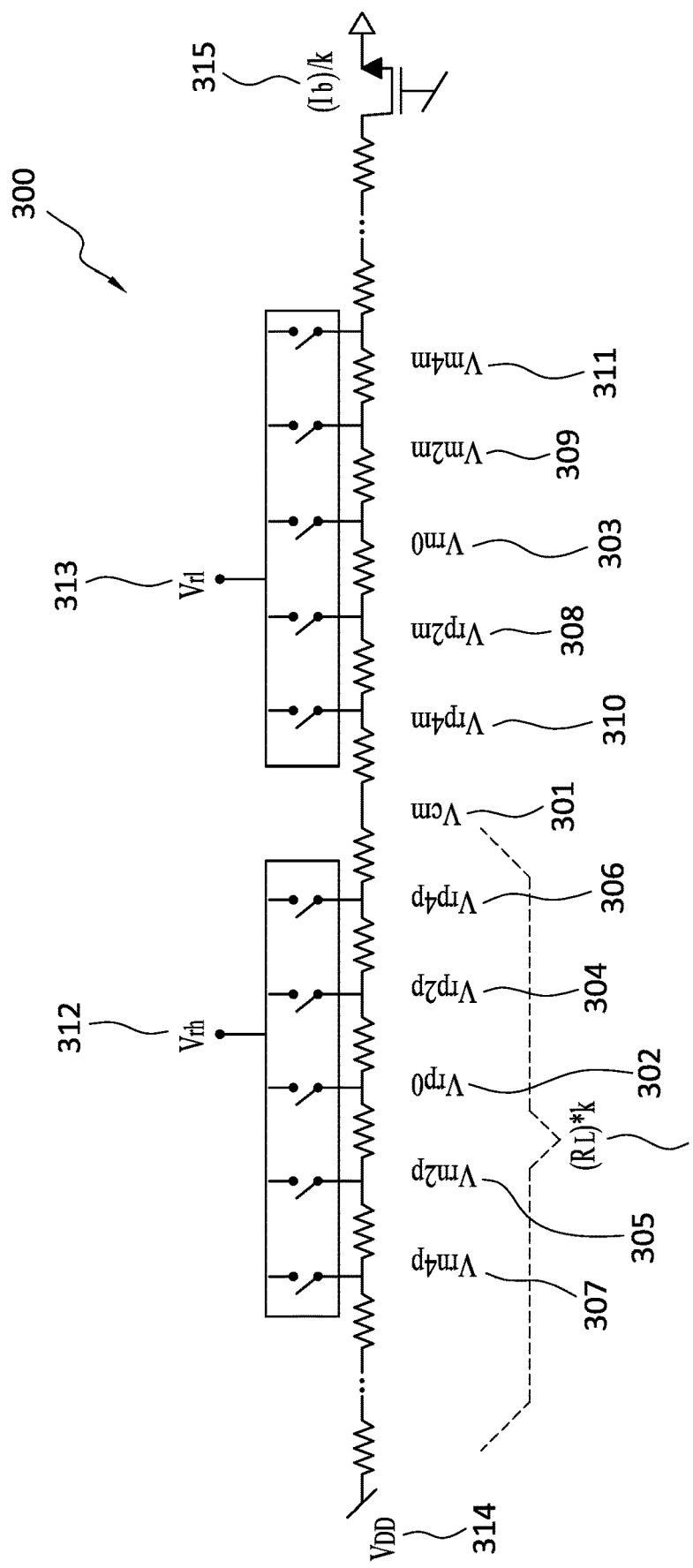
FIG. 3 illustrates a circuit diagram for a reference generator and selector of the current embodiment.

FIG. 3 illustrates a circuit diagram for a reference generator and selector 300 of the current embodiment.

The reference generator and selector circuitry 300 generates reference voltages, Vcm 301 which is equal to the output common mode voltage of the gain stage (VDD 314−Ib 315*RL 316), Vrp0 302,Vrn0 303, Vrp2p 304, Vrn2p 305, Vrp4p 306, Vrn4p 307, Vrp2m 308, Vrn2m 309 and Vrp4m 310, Vrn4m 311. Vrh 312 includes Vrp4p 306, Vrp2p 304, Vrp0 302, Vrn2p 305 and Vrn4p 307. Vrl 313 includes Vrp4m 310, Vrp2m 308, Vrn0 303, Vrn2m 309 and 4m4m 311.

By using the method of the current embodiment, maximum matching between voltages in the reference generator is ensured. A scaling factor may be applied to lower current and increase resistor values (RL*Ib=k* RL*Ib/k) to save current.

For example, the values of the reference voltages are chosen as G4p=(Vrp4p 306−Vrn4m 311)/(Vrp0 302−Vrn0 303)=+4 dB; G2p=(Vrp2p 304−Vrn2m 309)/(Vrp0 302−Vrn0 303)=+2 dB; G0=(Vrp0 302−Vrn0 303)/(Vrp0 302−Vrb0 303)=0 dB; G2m=(Vrn2p 305−Vrn2m 309)/(Vrp0 302−Vrn0 303)=−2 dB and G4m=(Vrn4p 307−Vrn4m 311)/(Vrp0 302−Vrn0 303)=−4 dB.

Figure 4:
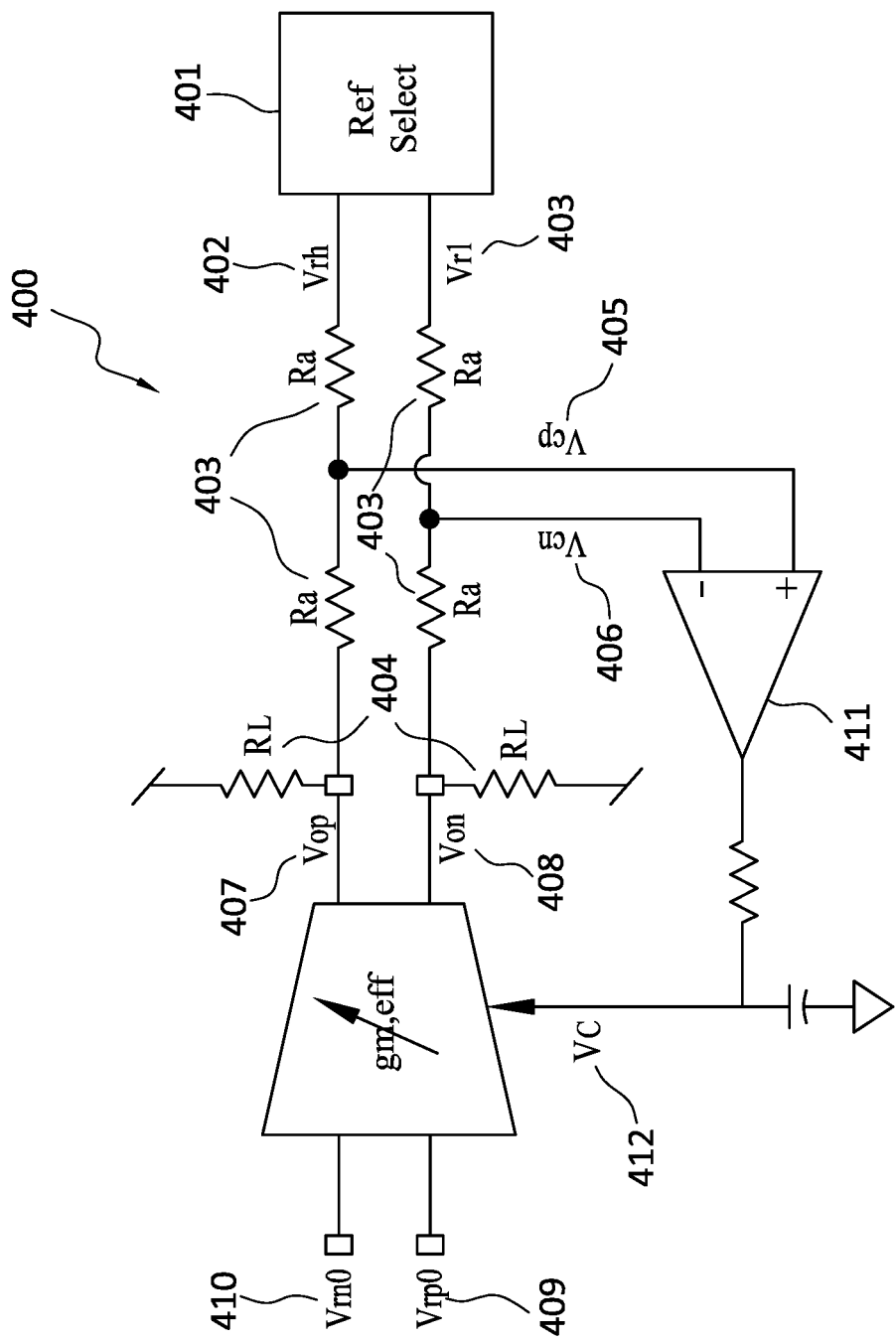
FIG. 4 illustrates a circuit diagram for a complete gain compensation circuitry of the current embodiment.

FIG. 4 illustrates a circuit diagram for a complete gain compensation circuitry 400 of the current embodiment.

The complete gain compensation circuitry 400, has Ra 403>>RL 404 to minimize the loading effect.

The reference generator and selector block 401 may choose the Vrh 402 and Vrl 403 voltages for each gain step (e.g., G4p, G2p, G0, G2m, G2m) and the reference voltage pairs are Vrpxy and Vrnxy.

$$Vop\ 407 = Vcm + Gx*Vrp0\ 409 = Vrpxx$$

$$Von\ 408 = Vcm − Gx*Vrn0\ 410 = Vrnxx$$

The feedback loop maintains Vcp 405=Vcn 406=Vcm in stable condition. The error amplifier 411 output (Vc 412=Vcontrol) will be applied to the gate of the Rsw (as illustrated in FIG. 2).

The feedback loop maintains the gain equal to G4p, G2p, G0, G2m, and G2m because the feedback loop maintains the output voltages (which are equal to the applied voltages to Vrh 402 and Vrl 403) as G4p: Vop 407, Von 408=Vrp4p, Vrn4p; G2p: Vop 407, Von 408=Vrp2p,Vrn2p; G0: Vop 407, Von 408=Vrp0,Vrn0; G2n: Vop 407, Von 408=Vrp2m, Vrn2m; G4n: Vop 407, Von 408=Vrp4m, Vrn4m.

The gain is set to a ratio of the reference voltages generated from the same reference generators and therefore have a higher accuracy.

In an alternative embodiment, when the Rsw transistors are only being used as switches, voltage, Vc may be applied to adjust bias current of a differential pair. This alternative embodiment may be used for small signal applications or for higher voltage applications, where increasing bias current and equally reducing headroom will not impact the performance.

The effective transconductance, Gm,eff and the load resistance, RL of the gain control circuit may be either the same as the transconductance, gm of the main gain stage or may be a scaled down version of the transconductance, gm with a smaller area and current.

The achieved control voltage, Vc may be applied to the main gain stages.

Figure 5:
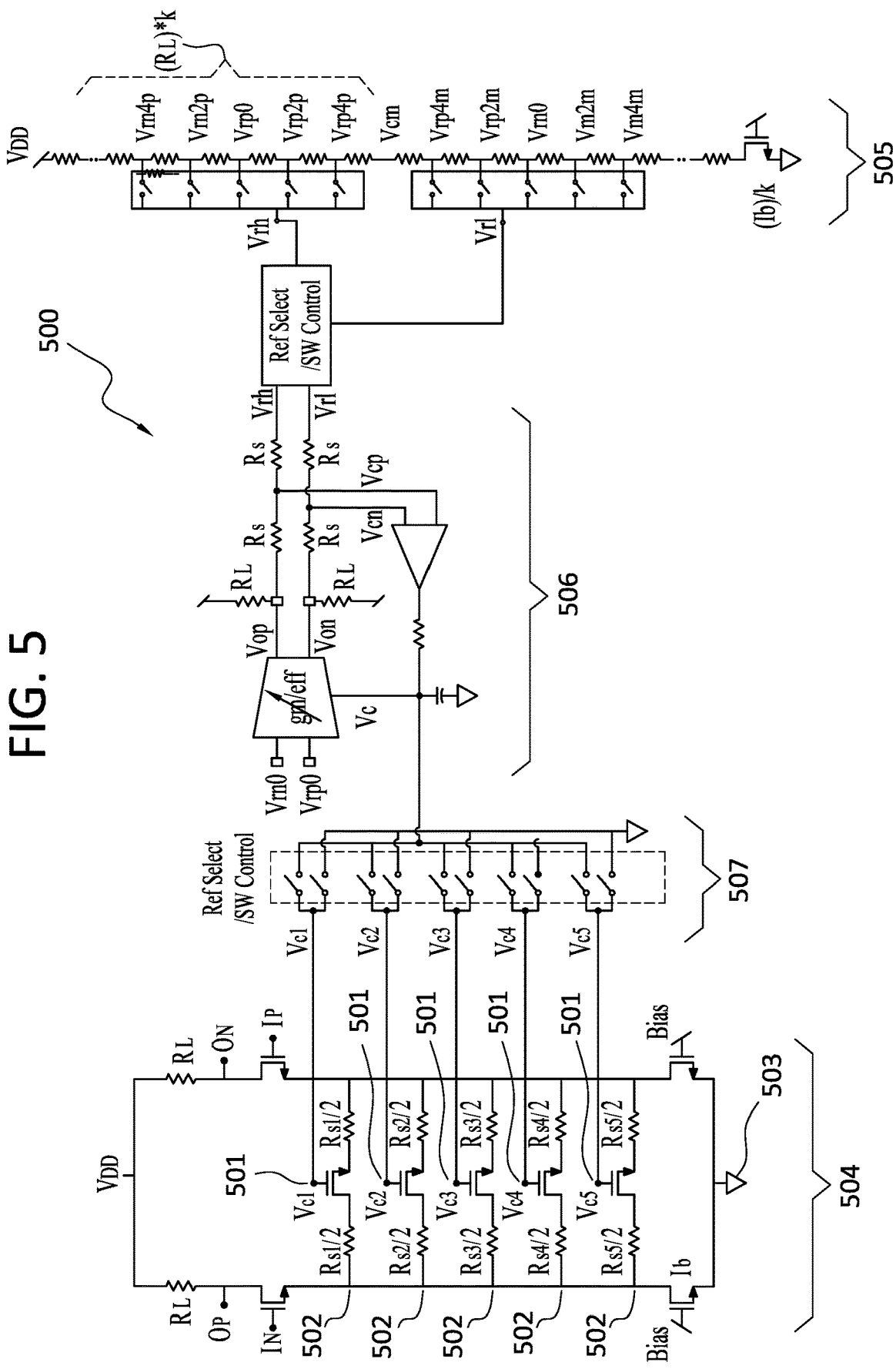
FIG. 5 illustrates a circuit diagram for a complete gain of the current embodiment with gain compensation applied to degeneration resistor.

FIG. 5 illustrates a circuit diagram 500 for a complete gain control stage of the current embodiment.

The circuit diagram 500 includes simple open loop gain stage circuitry 504, a reference selector 507, a reference generator and selector 505 and a complete gain compensation circuitry 506.

In FIG. 5, Vc 501 may be applied to the gate of the Rsw resistor 502 and the selected degeneration resistor, Rsw 502 may be connected to Vc 501 to maintain the constant gain while other degeneration resistors, Rsw may be connected to ground 503.

Figure 6:
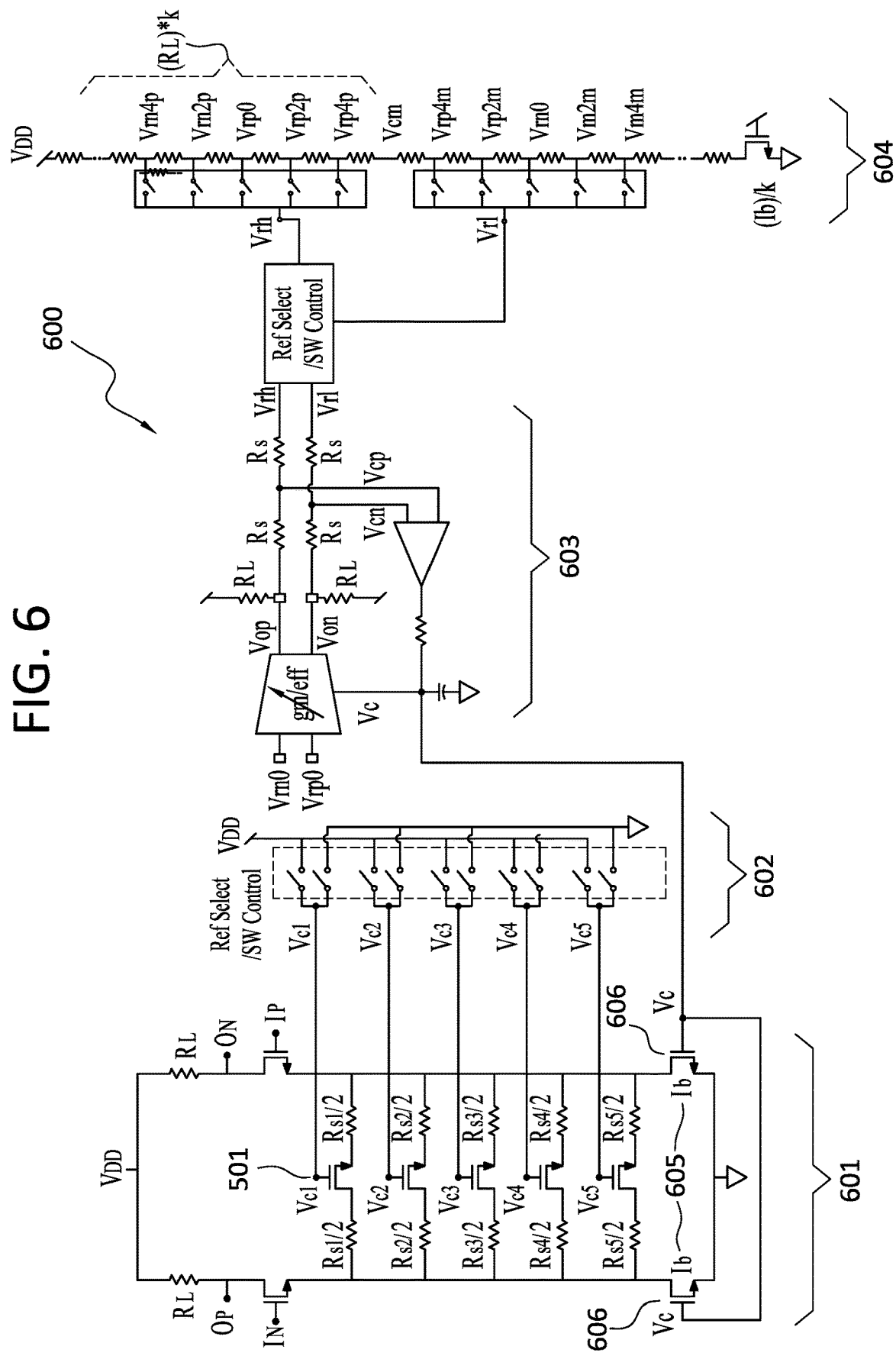
FIG. 6 illustrates a circuit diagram for a complete gain stage with gain compensation applied to bias current of a differential pair to control gm0 of the current embodiment.

FIG. 6 illustrates a circuit diagram 600 for a complete gain stage with gain compensation applied to bias current of a differential pair to control transconductance, gm0 of the current embodiment.

The circuit diagram 600 includes simple open loop gain stage circuitry 601, a reference selector 602, a reference generator and selector 604 and a complete gain compensation circuitry 603.

The simple open loop gain stage 601 controls the bias current 605 of the differential pair of transistors 606 in order to maintain constant gain.

The current embodiment may be used for various open loop gain stage circuitry to adjust Gain=Gm*RL variation over PVT and various low speed or high speed gain stage circuitry in wireless or wired applications may use this technique. It may also be used for a single step or multiple step gain stage and may be used for high speed and low speed applications and for low and high dynamic range applications, with performance similar to a closed loop gain stage.

It should be apparent from the foregoing description that various exemplary embodiments of the invention may be implemented in hardware. Furthermore, various exemplary embodiments may be implemented as instructions stored on a non-transitory machine-readable storage medium, such as a volatile or non-volatile memory, which may be read and executed by at least one processor to perform the operations described in detail herein. A non-transitory machine-readable storage medium may include any mechanism for storing information in a form readable by a machine, such as a personal or laptop computer, a server, or other computing device. Thus, a non-transitory machine-readable storage medium may include read-only memory (ROM), random-access memory (RAM), magnetic disk storage media, optical storage media, flash-memory devices, and similar storage media and excludes transitory signals.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Accordingly, it is to be understood that the above description is intended to be illustrative and not restrictive. Many embodiments and applications other than the examples provided would be apparent upon reading the above description. The scope should be determined, not with reference to the above description or Abstract below, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A circuit for maintaining constant gain in an open loop gain stage amplifier, the circuit comprising:
   a reference signal generator configured to generate a plurality of reference voltages;
   a gain compensation circuit, including:
      a reference selector configured to select one of the plurality of reference voltages for each of a plurality of gain stages;
      an error amplifier configured to output a control voltage signal to a selector, where the control voltage signal keeps gain constant over process/voltage/temperature (PVT) and adjusts a bias current of a differential pair of transistors;
      a selector configured to select which of a plurality of degeneration resistors in the open loop gain stage amplifier to apply the control voltage signal, wherein the control voltage signal is applied to a gate of at least one of the plurality of degeneration resistors in the open loop gain stage amplifier.

2. The circuit for maintaining constant gain in the open loop gain stage amplifier of claim 1, further comprising:
   a feedback loop configured to maintain the gain for each of the plurality of gain stages with the plurality of reference voltages.

3. The circuit for maintaining constant gain in the open loop gain stage amplifier of claim 1, wherein the open loop gain stage amplifier is implemented in a complementary metal-oxide semiconductor ("CMOS") transistor and a bipolar CMOS transistor.

4. The circuit for maintaining constant gain in the open loop gain stage amplifier of claim 1, wherein the reference signal generator matches each of the plurality of reference voltages to another one of the plurality of reference voltages.

5. The circuit for maintaining constant gain in the open loop gain stage amplifier of claim 1, wherein the reference signal generator includes a scaling factor to lower current and increase a degeneration resistor value to save current.

6. The circuit for maintaining constant gain in the open loop gain stage amplifier of claim 1, wherein the gain for each of the plurality of gain stages is a ratio of the plurality of reference voltages.

7. A method for maintaining constant gain in an open loop gain stage amplifier, the method comprising the steps of:
   generating, by a reference signal generator, a plurality of reference voltages;
   selecting, by a reference selector in a gain compensation circuit, one of the plurality of reference voltages for each of a plurality of gain stages;
   outputting, by an error amplifier, a control voltage signal to a selector, where the control voltage signal keeps gain constant over process/voltage/temperature (PVT) and adjusts a bias current of a differential pair of transistors;
   selecting, by a selector, which of a plurality of degeneration resistors in the open loop gain stage amplifier to apply the control voltage signal, wherein the control voltage signal is applied to a gate of at least one of the plurality of degeneration resistors in the open loop gain stage amplifier.

8. The method for maintaining constant gain in the open loop gain stage amplifier of claim 7, the method further comprising:
   maintaining, by a feedback loop, the gain for each of the plurality of gain stages with the plurality of reference voltages.

9. The method for maintaining constant gain in the open loop gain stage amplifier of claim 7, wherein the open loop gain stage amplifier is implemented in a complementary metal-oxide semiconductor ("CMOS") transistor and a bipolar CMOS transistor.

10. The method for maintaining constant gain in the open loop gain stage amplifier of claim 7, wherein the reference signal generator matches each of the plurality of reference voltages to another one of the plurality of reference voltages.

11. The method for maintaining constant gain in the open loop gain stage amplifier of claim 7, wherein the reference signal generator includes a scaling factor to lower current and increase a degeneration resistor value to save current.

12. The method for maintaining constant gain in the open loop gain stage amplifier of claim 7, wherein the gain for each of the plurality of gain stages is a ratio of the plurality of reference voltages.

* * * * *